United States Patent
Klebanov et al.

(10) Patent No.: US 10,916,438 B2
(45) Date of Patent: Feb. 9, 2021

(54) METHOD OF MULTIPLE GATE OXIDE FORMING WITH HARD MASK

(71) Applicant: Allegro MicroSystems, LLC, Manchester, NH (US)

(72) Inventors: Maxim Klebanov, Manchester, NH (US); Sundar Chetlur, Bedford, NH (US); James McClay, Dudley, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/407,500

(22) Filed: May 9, 2019

(65) Prior Publication Data
US 2020/0357652 A1    Nov. 12, 2020

(51) Int. Cl.
*H01L 21/8238* (2006.01)
*H01L 21/8234* (2006.01)
(Continued)

(52) U.S. Cl.
CPC ...... *H01L 21/3086* (2013.01); *H01L 21/0332* (2013.01); *H01L 21/0338* (2013.01);
(Continued)

(58) Field of Classification Search
CPC ....... H01L 21/02164; H01L 21/823462; H01L 21/31116; H01L 21/32; H01L 21/28017;
(Continued)

(56) References Cited

U.S. PATENT DOCUMENTS 6,037,252 A    3/2000 Hillman et al.
6,069,070 A    5/2000 Labunov et al.
(Continued)

FOREIGN PATENT DOCUMENTS

JP    2012-253129 A    12/2012

OTHER PUBLICATIONS

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.
(Continued)

*Primary Examiner* — Caridad Everhart
(74) *Attorney, Agent, or Firm* — Daly Crowley Mofford & Durkee, LLP

(57) ABSTRACT

Methods for fabricating an integrated circuit having a plurality of gate dielectrics. The methods are provided to include: forming one or more isolation trenches and a first active region and a second active region in a substrate; depositing hard mask material on the substrate; removing a first portion of the hard mask material over the first active region; forming a first oxide layer having a first thickness over the first active region; removing a second portion of the hard mask material over the second active region; and forming a second oxide layer having a second thickness over the first and second active regions such that a thickness of oxide formed over the first active region comprises a sum of the thickness of the first oxide layer and the second oxide layer, and a thickness of oxide formed over the second active region comprises the second thickness.

14 Claims, 11 Drawing Sheets

(51) Int. Cl.
*H01L 21/336* (2006.01)
*H01L 21/308* (2006.01)
*H01L 21/033* (2006.01)
*H01L 29/51* (2006.01)

(52) U.S. Cl.
CPC .. *H01L 21/3081* (2013.01); *H01L 21/823437* (2013.01); *H01L 21/823481* (2013.01); *H01L 29/517* (2013.01)

(58) Field of Classification Search
CPC ....... H01L 29/42368; H01L 21/823878; H01L 21/762; H01L 21/8017; H01L 27/11526; Y10S 438/981
See application file for complete search history.

(56) References Cited

U.S. PATENT DOCUMENTS

| | | | |
|---|---|---|---|
| 6,083,835 | A | 7/2000 | Shue et al. |
| 6,124,171 | A * | 9/2000 | Arghavani ...... H01L 21/823462 257/E21.625 |
| 6,403,466 | B1 | 6/2002 | Lopatin |
| 6,429,118 | B1 | 8/2002 | Chen et al. |
| 6,579,788 | B1 | 6/2003 | Jones et al. |
| 7,001,783 | B2 | 2/2006 | Costrini et al. |
| 8,747,680 | B1 | 6/2014 | Deshpande et al. |
| 10,050,193 | B1 | 8/2018 | Klebanov et al. |
| 2002/0096775 | A1 | 7/2002 | Ning |
| 2003/0087532 | A1* | 5/2003 | Wu .................... H01L 21/31138 438/745 |
| 2003/0224598 | A1 | 12/2003 | Lee et al. |
| 2004/0012056 | A1 | 1/2004 | Nejad et al. |
| 2005/0136632 | A1* | 6/2005 | Rotondaro ........ H01L 21/28185 438/591 |
| 2006/0003511 | A1* | 1/2006 | Hebert ............ H01L 21/823857 438/199 |
| 2006/0202291 | A1 | 9/2006 | Kolb et al. |
| 2006/0258155 | A1 | 11/2006 | Sun et al. |
| 2007/0072311 | A1 | 3/2007 | Wilson et al. |
| 2007/0264422 | A1 | 11/2007 | Zimmer |
| 2008/0084205 | A1 | 4/2008 | Zimmer |
| 2008/0217775 | A1 | 9/2008 | Pai et al. |
| 2008/0230814 | A1* | 9/2008 | Lee ...................... H01L 27/088 257/288 |
| 2011/0008915 | A1 | 1/2011 | Nozieres et al. |
| 2011/0294291 | A1 | 12/2011 | Matsui et al. |
| 2013/0032908 | A1 | 2/2013 | Tang et al. |
| 2014/0241047 | A1 | 8/2014 | Guo |
| 2014/0327096 | A1 | 11/2014 | Guo |
| 2014/0328116 | A1 | 11/2014 | Guo |
| 2014/0332914 | A1 | 11/2014 | Liou et al. |
| 2015/0200355 | A1 | 7/2015 | Erie et al. |
| 2017/0371007 | A1 | 12/2017 | Anderson et al. |
| 2018/0033955 | A1 | 2/2018 | Wong et al. |

OTHER PUBLICATIONS

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.mircochem.com/Prod-PMGI_LOR.htm; Feb. 14, 2012; 2 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

PCT Partial Search Report dated Apr. 23, 2015 for International Application No. PCT/US2015/011104; 2 Pages.

PCT International Search Report and Written Opinion dated Jul. 20, 2015 for International Application No. PCT/US2015/011104; 18 Pages.

PCT International Preliminary Report dated Jul. 19, 2016 for International Application No. PCT/US2015/011104; 11 Pages.

U.S. Non-Final Office Action dated Mar. 24, 2017 for U.S. Appl. No. 15/219,694; 17 Pages.

Response to U.S. Non-Final Office Action dated Mar. 24, 2017 for U.S. Appl. No. 15/219,694; Response filed Jun. 22, 2017; 12 Pages.

U.S. Appl. No. 16/047,342, filed Jul. 27, 2018, Campiglio et al.

U.S. Appl. No. 16/122,019, filed Sep. 5, 2018, Liu et al.

U.S. Appl. No. 16/280,199, filed Feb. 20, 2019, Liu et al.

* cited by examiner

METHOD OF MULTIPLE GATE OXIDE FORMING WITH HARD MASK

BACKGROUND

A gate oxide (GOX) is a dielectric layer disposed between a substrate (i.e., a wafer) and a gate contact in a MOS-based device. The gate oxide is generally formed by oxidizing silicon of a conductive channel to form a thin (for example, 5-200 nm) insulating layer of silicon dioxide. Conventionally, a conductive gate material is subsequently deposited over the gate oxide to form a transistor.

In conventional methods of forming multiple gate oxides (e.g., Dual-GOX or Triple-GOX) in which each of the gate oxides have different characteristics, some portion of oxide on the substrate may need to be removed (i.e., etched away) and grown again. Thus, an extra cycle of oxide growth in some regions may happen. This extra cycle of oxide growth may contribute to additional silicon stress that may cause transistor leakage. Additionally, the etching process to remove oxide already formed on the substrate may create divots (e.g., Shallow Trench Isolation (STI) divots) in isolation trenches near the region where the oxide is etched away. The divots may cause additional leakage in the transistor.

SUMMARY

In accordance with the concepts, systems and techniques described herein, an inventive process of forming multiple gate oxides for MOS-based wafer technologies is presented. The inventive gate oxide forming approach described herein aims to reduce (or preferably eliminate) silicon defect formation by reducing the number of oxide formation cycles, as compared with conventional processing techniques. Furthermore, the approach also aims to prevent the formation of divots in isolation trenches near the edges of silicon oxidation which may cause leakage between device regions. A divot may form a parasitic leakage path between different portions of device structure. For example, when a divot is fairly deep, its bottom edge may reach down to the bottom of a Source/Drain (S/D) diffusion, where S/D regions may form a junction with a well containing the divot (particularly the bottom edge of the divot). Once a divot reaches that far, it may cause a leakage (i.e., a parasitic leakage) between S/D region and the well.

According to one illustrative embodiment, a method for fabricating an integrated circuit may include: forming one or more isolation trenches and a first active region and a second active region in a substrate; depositing hard mask material on the substrate; removing a first portion of the hard mask material over the first active region; forming a first oxide layer having a first thickness over the first active region; removing a second portion of the hard mask material over the second active region; and forming a second oxide layer having a second thickness over the first and second active regions such that a thickness of oxide formed over the first active region comprises a sum of the thickness of the first oxide layer and the second oxide layer, and a thickness of oxide formed over the second active region comprises the second thickness.

In embodiments, the step of removing the first portion of the hard mask material may further include: performing a photolithography process to expose the first active region; performing an etching process to remove the first portion of the hard mask material over the first active region; and removing photoresist material over the second active region.

In embodiments, the step of removing the second portion of the hard mask material may further include: performing an etching process to remove the second portion of the hard mask material over the second active region.

In embodiments, each of the one or more isolation trenches may comprise a Shallow Trench Isolation (STI) structure.

In embodiments, the hard mask material may comprise at least one of Silicon Nitride (SiN), PolySilicon (poly-Si), and/or oxide-nitride-oxide (ONO) stack.

According to another illustrative embodiment, a method for fabricating an integrated circuit may include: forming one or more isolation trenches and a first active region, a second active region, and a third active region in a substrate; depositing hard mask material on the substrate; removing a first portion of the hard mask material over the first active region; forming a first oxide layer having a first thickness over the first active region; removing a second portion of the hard mask material over the second and third active regions; forming a second oxide layer having a second thickness over the first, second and third active regions; removing oxide formed over the third active region; and forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness.

In embodiments, the step of removing the first portion of the hard mask material may further include: performing a photolithography process to expose the first active region; performing an etching process to remove the first portion of the hard mask material over the first active region; and removing photoresist material over the second and third active regions.

In embodiments, the step of removing the second portion of the hard mask material may further include: performing an etching process to remove the second portion of the hard mask material over the second and third active regions.

In embodiments, the step of removing oxide over the third active region may further include: performing a photolithography process to expose the third active region; performing an etching process to remove oxide over the third active region; and removing photoresist material over the first and second regions.

According to yet another illustrative embodiment, a method for fabricating an integrated circuit may comprise: forming one or more isolation trenches and a first active region, a second active region, and a third active region in a substrate; depositing hard mask material on the substrate; removing a first portion of the hard mask material over the first active region; forming a first oxide layer having a first thickness over the first active region; removing a second portion of the hard mask material over the second active region; forming a second oxide layer having a second thickness over the first and second active regions; removing a third portion of the hard mask material over the third active region; and forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness.

In embodiments, the step of removing the first portion of the hard mask material may further include: performing a photolithography process to expose the first active region; performing an etching process to remove the first portion of the hard mask material over the first active region; and removing photoresist material over the second and third active regions.

In embodiments, the step of removing the second portion of the hard mask material may further include: performing a photolithography process to expose the second active region; performing an etching process to remove the second portion of the hard mask material over the second active region; and removing photoresist material over the first and third active regions.

In embodiments, the step of removing the third portion of the hard mask material may further include: performing an etching process to remove the third portion of the hard mask material over the third active region.

The details of one or more embodiments of the disclosure are outlined in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which.

DETAILED DESCRIPTION

All relative descriptions herein, such as left, right, up, and down, are with reference to the figures, are merely relative and not meant in a limiting sense. Unless otherwise specified, the described embodiments may be understood as providing illustrative features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

Figure 1:
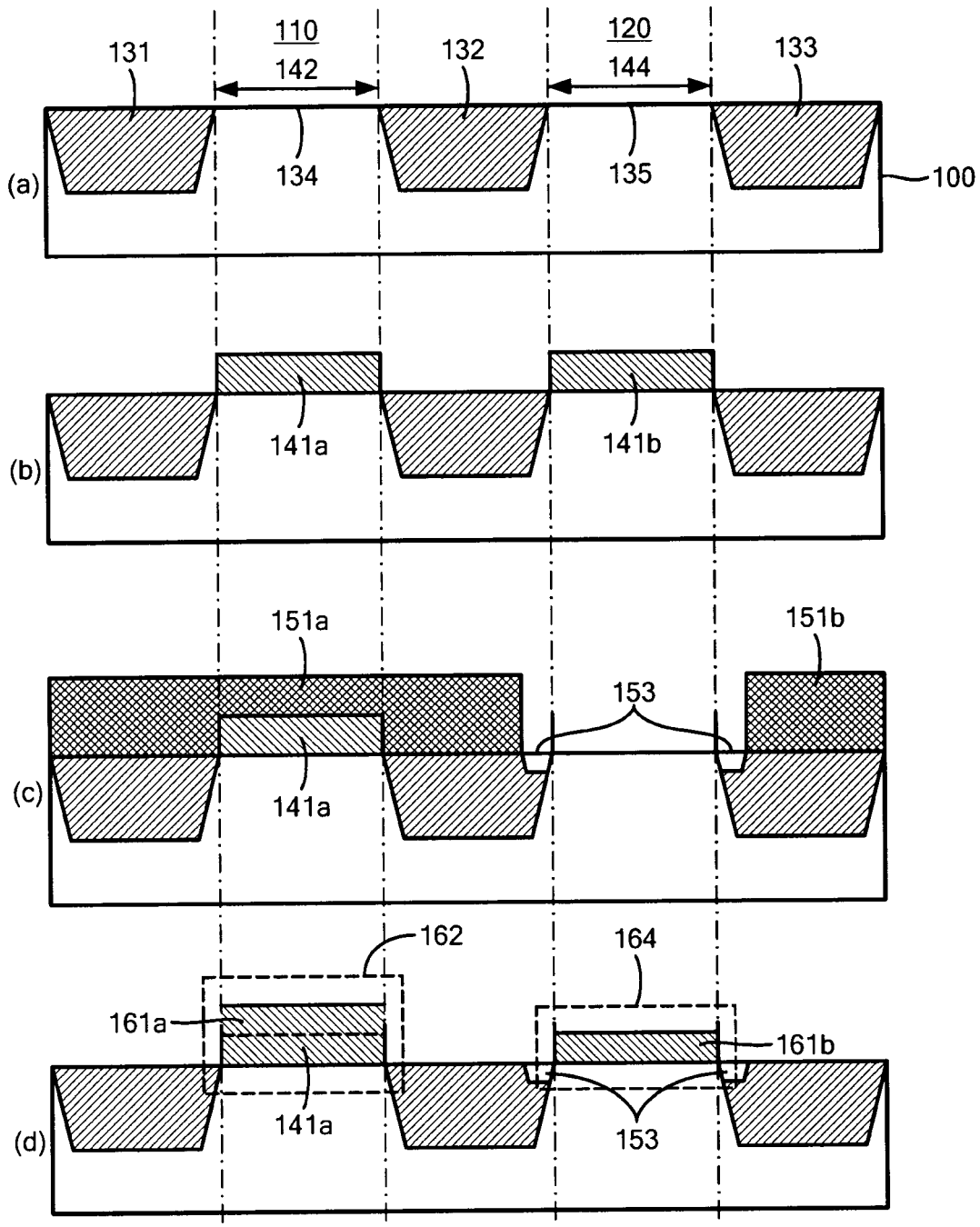
FIG. 1 is a diagram illustrating a conventional process for forming dual gate oxides (Dual-GOX)

Referring now to FIG. 1, dual gate oxides (Dual-GOX) are formed in a substrate 100 using a conventional multiple gate oxide forming method. As described below in detail, other types of gate dielectrics may be formed instead of the gate oxides. In step (a), one or more isolation trenches 131, 132, 133 are formed in a substrate 100. The remaining regions of the substrate 100 form a surface 134 in a first active region 110 and a surface 135 in a second active region 120. The active regions 110, 120 may comprise the same or different widths 142, 144. The isolation trenches 131, 132, 133 may comprise a Shallow Trench Isolation (STI) structure. The isolation trenches 131, 132, 133 may be filled with a suitable material, such as oxide or silicon nitride (SiN). In step (b), a layer of oxide 141a, 141b is formed on the surface 134 in the first active region 110 and on the surface 135 in the second active region 120. The oxide 141a, 141b may be grown in a furnace, but other suitable methods may be used. In step (c), a photolithography process is performed to expose the second active region 120. Accordingly, photoresist mask 151a, 151b may cover the surface of the substrate 100 except the second active region 120. An etching process is then performed to remove the oxide 141b formed over the second active region 120. When the oxide 141b is removed during the etching process, some portion of the isolation trench material 132, 133 may be etched away, which results in "divots" 153 in the isolation trenches 132, 133. The remaining photoresist mask 151a, 151b material is then stripped (i.e., removed). The oxide 141a over the first active region 110 is exposed while the oxide 141b over the second active region 120 is removed. In step (d), a second layer of oxide 161a, 161b is grown over the first active region 110 and the second active region 120 respectively. Accordingly, a thickness of a first gate oxide 162 over the first active region 110 comprises a sum of the first oxide layer 141a and the second oxide layer 161a, and the thickness of a second gate oxide 164 formed over the second active region 120 comprises the thickness of the second oxide layer 161b.

Accordingly, the gate oxides over the first and second active regions may have different characteristics, and thus, oxides of different thickness are formed to achieve device structures of different characteristics. Thinner gate oxides allow to scale metal-oxide-semiconductor (MOS) transistors to be formed in a smaller size. For example, 35 A N-type MOS (NMOS) or P-type MOS (PMOS) transistors on SG8 technology are smaller than 90 A NMOS/PMOS transistors. The 35 A NMOS/PMOS transistors also operate at lower voltages than 90 A NMOS/PMOS transistors (e.g., 1.8V for 35 A vs 3.3V for 90 A).

The divots 153 in the isolation trenches 132, 133 may cause leakage between transistors. Particularly, the presence of a divot (e.g., 153) may cause a difference in the thickness of an active region (e.g., 120) as the thickness of the active region decreases near an isolation trench (e.g., 132). When a material such as gate dielectric or gate fills the divot 153, the material may form a "corner device." The corner device may cause leakage between transistors because a conductive inversion layer may be formed near the divot 153 at a lower voltage than the normal turn-on voltage of the central portions of the device due to the difference in the thickness of the active region 120 near the divot 153. Furthermore, a divot may form a parasitic leakage path between different portions of device structure. For example, when a divot is fairly deep, its bottom edge may reach down to the bottom of a Source/Drain (S/D) diffusion, where S/D regions may form a junction with a well containing the divot (particularly the bottom edge of the divot). Once a divot reaches that far, it may cause a leakage (i.e., parasitic leakage) between S/D region and the well.

Figure 2A:
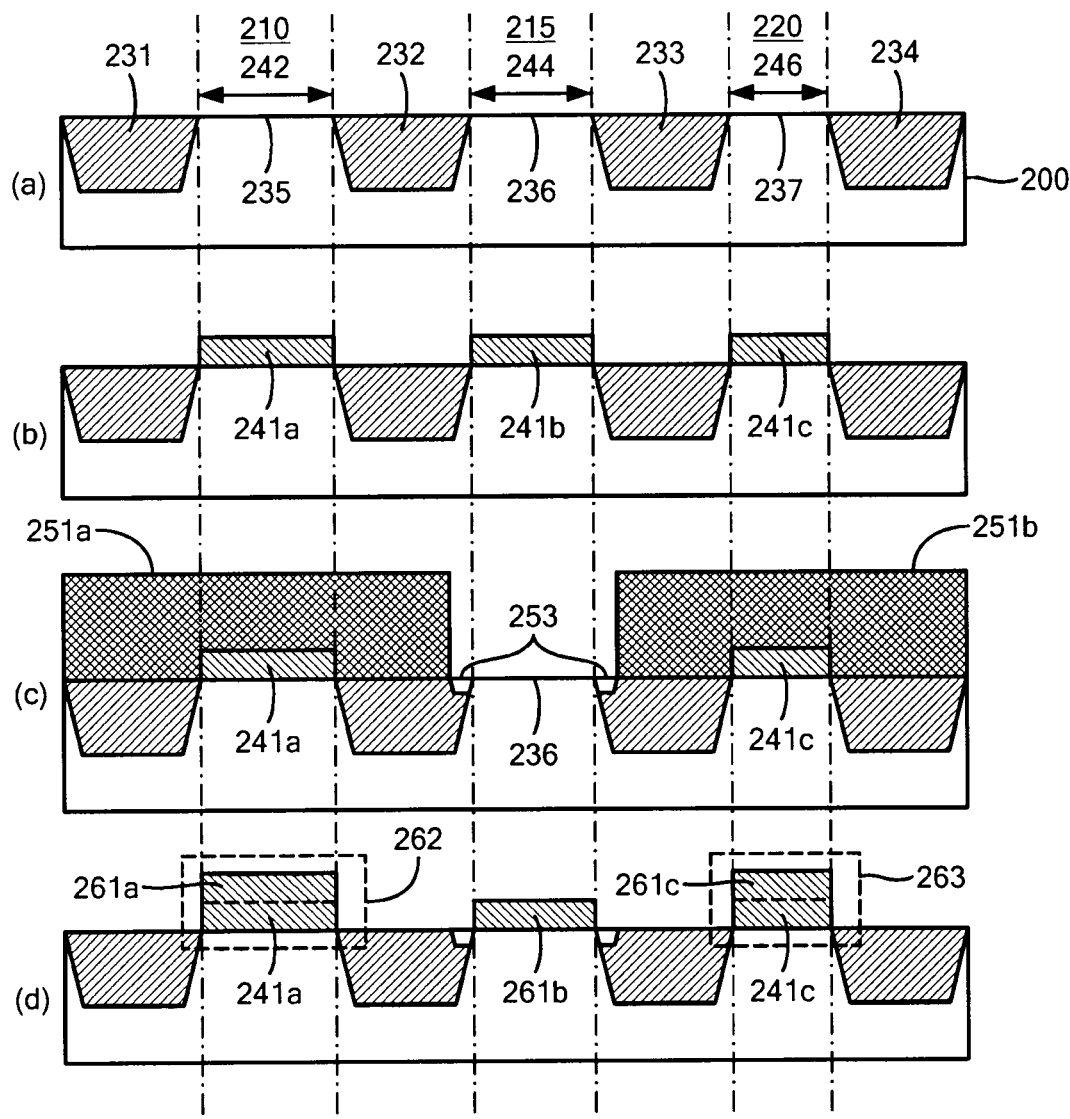
FIGS. 2A-2B are diagrams illustrating a conventional process for forming triple gate oxides (Triple-GOX)
Figure 2B:
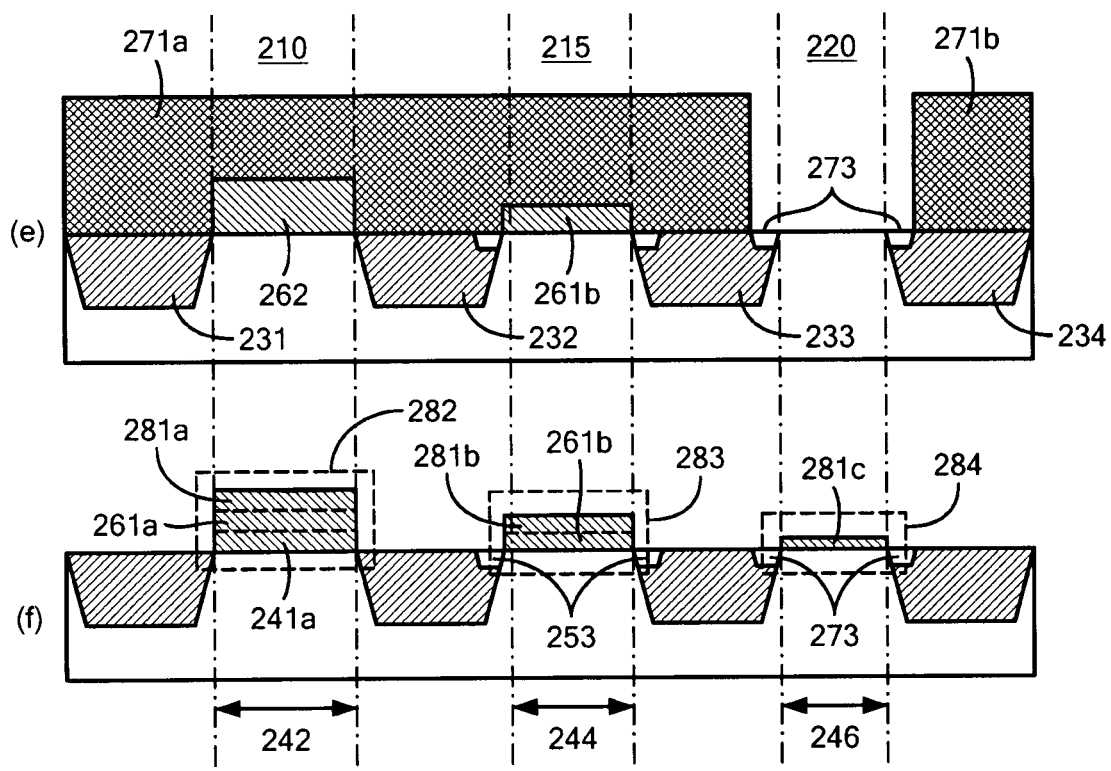

Referring now to FIGS. 2A and 2B, triple gate oxides (Triple-GOX) are formed in a substrate 200 using a conventional multiple gate oxide forming method. As described below in detail, other types of gate dielectrics may be formed instead of the gate oxides. Referring to FIG. 2A, in step (a), one or more isolation trenches 231, 232, 233, 234 are formed in the substrate 200. The remaining regions of the substrate 200 may form a surface 235 on a first active region 210, a surface 236 on a second active region 215, and a surface 237 on a third active region 220 respectively. The active regions 210, 215, 220 may comprise the same or different widths 242, 244, 246. The isolation trenches 231, 232, 233, 234 may comprise Shallow Trench Isolation (STI). The isolation trenches may be filled with a suitable material, such as oxide. In step (b), a layer of oxide 241a, 241b, 241c is formed on the surfaces 235, 236, 237 over the first, second, and third active regions 210, 215, 220 respectively. The oxide 241a, 241b, 241c may be grown in a furnace, but other suitable methods may be used. In step (c), a first photolithography process is performed to expose the area over the second active region 215. Here, photoresist mask 251a, 251b may cover the surface of the substrate 200 except the second active region 215. A first etching process is then performed to remove the oxide 241b formed over the second active region 220. When the oxide 241b is removed during the etching process, some portions of the isolation trench 232, 233 next to the second active region 215 may be etched away, which result in forming "divots" 253 in the isolation trenches 232, 233. The photoresist mask 251a, 251b material is then stripped. Accordingly, the oxide 241a in the first active region 210 and the oxide 241c in the third active region 220 are exposed while the oxide 241b over the second active region 215 is removed, which exposes the surface 236 on the second active region 215. In step (d), a second layer of oxide 261a, 261b, 261c is grown over the first, second, and third active regions 210, 215, 220 respectively. Accordingly, the thickness of the oxide 262 formed over the first active region 210 comprises a sum of the thickness of the first oxide layer 241a and second oxide layer 261a. The thickness of the oxide 263 formed over the third active region 220 comprises a sum of the thickness of the first oxide layer 241c and the second oxide layer 261c. The oxide formed over the second active region 215 has a thickness of the second oxide layer 261b.

Referring to FIG. 2B, in step (e), a second photolithography process is performed to expose the area over the third active region 220. Here, photoresist mask 271a, 271b may cover the surface of the substrate 200 except the third active region 220. A second etching process is then performed to remove the oxide 241c, 261c (collectively oxide 263) formed over the third active region 220. When the oxide 263 is removed from the surface 237 over the third active region 220 by the etching process, divots 273 may be formed in isolation trenches 233, 234 near the third active region 220. The photoresist mask 271a, 271b material is then stripped. Accordingly, the oxide formed over the first active region 210 and the oxide formed over the second active region 215 are exposed while the oxide formed over the third active region 220 is removed, which exposes surface 237.

In step (f), a third layer of oxide 281a, 281b, 281c is grown over the first, second, and third active regions 210, 215, 220 respectively. Accordingly, a first gate oxide 282 formed over the first active region 210 has a thickness that is a sum of the first oxide layer 241a, the second oxide layer 261a, and the third oxide layer 281a. The second gate oxide 283 formed over the second active region 215 has a thickness that is a sum of the second oxide layer 261b and the third oxide layer 281b. The third gate oxide 284 formed over the third active region 220 comprises the third oxide layer 281c. Accordingly, the gate oxides over the first, second, and third active regions may have different characteristics.

As described above in conjunction with FIG. 1, the divots 253, 273 formed in the isolation trenches 232, 233, 234 may cause leakage between transistors. In addition, while the second and third active regions 215, 220 need two layers and one layer of oxide respectively, three layers of oxide 241b, 261b, 281b are grown and one oxide layer 241b is etched away over the second active region 215, and three layers of oxide 241c, 261c, 281c are grown and two oxide layers 241c, 261c are etched away over the third active region 220. These extra cycles of oxide growth and removal over the second and third active regions 215, 220 may contribute to an increase in the silicon stress, caused by the proximity of isolation trench regions, because the isolation trench regions (e.g., regions 231, 232, 233, 234) are generally filled with silicon oxide, which has different mechanical properties from silicon of the substrate (e.g., 200). When heating and cooling is applied to the substrate 200 during, for example, gate oxidations, isolation trench regions and silicon regions (e.g., 210, 215, 220) will have different expansion and contraction dynamics. These different expansion and contraction cause mechanical stress. The amount of stress is determined from a complex function of local density of isolation trench regions vs silicon regions. However, in general, the stress is highest near the interface between isolation trench regions and active silicon regions. The finer the pitch of isolation trench regions, the higher the stress in the active silicon regions. The added stress on the substrate may lead to silicon defects (dislocations) that may cause additional leakage in transistors.

Figure 3:
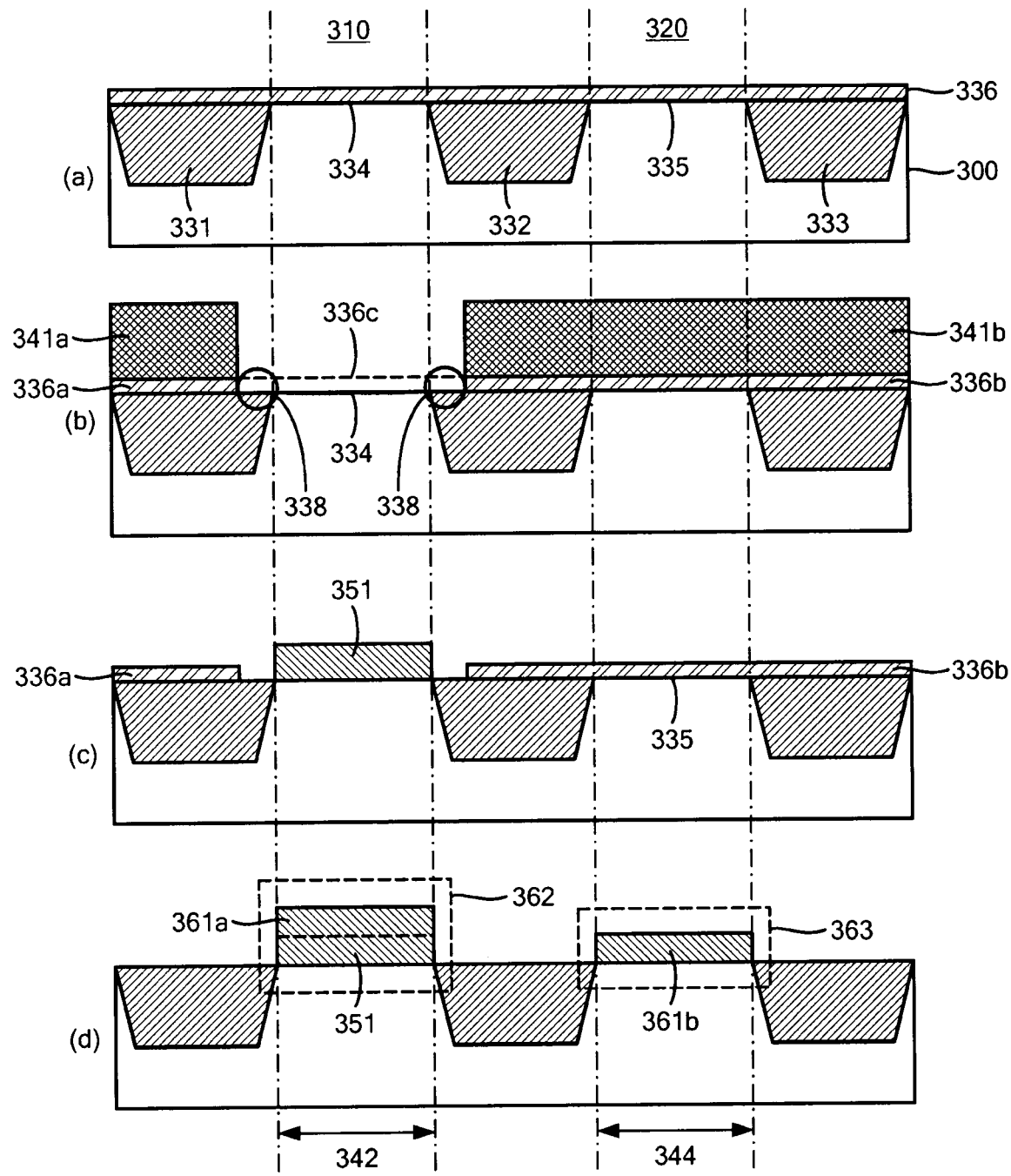
FIG. 3 is a diagram illustrating a process for forming dual gate oxides (Dual-GOX) according to an inventive concept described herein.

Referring now to FIG. 3, dual gate oxides (Dual-GOX) are formed in a substrate 300 using a hard mask according to the inventive concepts described herein. The embodiment shown in FIG. 3 includes dual gate oxides, but as can be appreciated by the person in the pertinent art, the method described below can be applied to other types of gate dielectric. For example, in one embodiment, the gate oxides 363, 363 may comprise a furnace-grown Silicon Dioxide (SiO2), but in another embodiment, the gate oxides may be replaced by other type of gate dielectric, such as a gate dielectric comprising a high-K dielectric (i.e., material having a high dielectric constant K), which is formed with help of other materials (e.g., addition of Nitrogen).

In step (a), one or more isolation trenches 331, 332, 333 are formed in a substrate 300. The remaining regions of the substrate 300 may form a surface 334 on a first active region 310 and surface 335 on a second active region 320. In embodiments, the one or more isolation trenches 331, 332, 333 may comprise Shallow Trench Isolation (STI) structure and the isolation trenches may be filled with a suitable material, such as oxide. In embodiments, the active regions 310, 320 may have the same or different widths 342, 344, while the widths are determined based upon the characteristics of gate oxides formed over the respective active regions. A hard mask layer 336 may be deposited on a surface of the substrate 300 where the isolation trenches and active regions are located. Here, the term "hard mask" is used to describe a type of barrier that is used during a photolithography/etch process, which can be distinguished from photoresist mask (i.e., soft mask) while the hard mask may comprise material such as Silicon Dioxide (SiO2), Silicon Nitride (SiN), or TiN (Sn). In embodiments described herein, the hard mask 336 may comprise at least one of Silicon Nitride (SiN), PolySilicon (poly-Si), and/or oxide-nitride-oxide (ONO) stack. Alternatively, any other suitable materials may be used to form the hard mask, which can a) withstand oxidation process (i.e., not get burnt in the furnace) and b) provide a barrier against oxidation of silicon layer underneath.

In step (b), a photolithography process is performed to expose the area over the first active region 310. Here, photoresist masks 341a, 341b may be formed on the surface of the substrate 300 except the first active region 310. A first etching process is then performed to remove a portion of the hard mask 336c over the first active region 320. In embodiments, the photolithography process defines areas clear of photoresist masks 341a, 341b. An etching process is then performed, where the etching process may comprise a liquid chemical etching performed in a wet bench tool, a reactive etching in a chamber (i.e., plasma etching), or a physical etching (e.g., material removal by bombardment) in a chamber. The photoresist mask 341a, 341b serve as a (soft) mask to protect areas of hard mask that need to stay. In the area clear of photoresist (i.e., exposed to the etching process), the hard mask will be etched away. Accordingly, the surface 334 on the first active region 310 is exposed, while the other area of the surface including the surface 335 on the second active region 320 is covered by the hard mask 336a, 336b. In embodiments, some portions 338 of the hard mask 336 may also be removed on the isolation trenches 331, 332 near the first active region 310. Since the hard mask 336 comprises a different material from the material filling the isolation trenches, divots are not created when the portion of the hard mask is removed by the etching process. In embodiments, the hard mask material 336 may be etched away with high selectivity to oxide, resulting in no loss of oxide at the corners of the isolation trenches.

In step (c), the photoresist masks 341a, 341b are then stripped. A layer of oxide 351 is then formed (i.e., grown) over the first active region 310. Since the surface in the second active region 320 is covered by the hard mask 336b, no oxide is grown in the second active region 320. In embodiments, oxygen in a furnace will react with exposed silicon (i.e. active regions 310, 315, 320) to form silicon dioxide (SiO2). Once the surface layer of oxide is formed, the oxidation will continue but at a slower rate because new oxygen atoms will need to first diffuse through the already formed oxide down to the surface of unreacted silicon. Here, the isolation trench (e.g., STI) regions have a thick oxide fill, so the oxygen from the furnace atmosphere cannot diffuse through (other than near the narrow corners of the isolation trenches). Similarly, the hard mask 336b blocks the diffusion of oxygen such that no oxide is grown over the hard mask 336b.

In step (d), a further etching process is then performed to remove the hard mask 336a, 336b material from the surface of the substrate 300. In embodiments, the hard masks 336a, 336b may be blanket-etched (i.e., no mask is applied). Accordingly, the surface 335 on the second active region 320 is exposed. A second layer of oxide 361a, 361b is grown over the first and second active regions 310, 320 respectively. Accordingly, a first gate oxide 362 formed over the first active region 310 has a thickness that is a sum of the first oxide layer 351 and the second oxide layer 361a. The second gate oxide 363 formed over the second active region 320 has a thickness of the second oxide layer 361b. Further, the active regions 310, 320 may have the same or different widths. For example, the width 344 of the active region 320 may be narrower than the width 342 of the active region 310. In other embodiments, the active regions 310, 320 may comprise the same width. Accordingly, the gate oxides 362, 363 over the first and second active regions 310, 320 may have different characteristics, and thus, oxides of different thickness are formed to achieve device structures of different characteristics. In embodiments, thinner gate oxides allow to scale metal-oxide-semiconductor (MOS) transistors to be formed in a smaller size. For example, 35 A N-type MOS (NMOS) or P-type MOS (PMOS) transistors on SG8 technology are smaller than 90 A NMOS/PMOS transistors. The 35 A NMOS/PMOS transistors also operate at lower voltages than 90 A NMOS/PMOS transistors (e.g., 1.8 V for 35 A vs 3.3 V for 90 A).

By using the hard mask material 336, the oxide is formed only in the region where a layer of oxide is needed. For example, over the first active region 310, two layers of oxide are grown, while only one layer of oxide is grown over the second active region 320. Thus, there is no need for removal of oxide over the second active region 320. Accordingly, there are fewer oxide growth cycles over the second active region 320, as compared with conventional processing techniques, which results in less stress to the substrate. Accordingly, a leakage that was caused by additional stress may be prevented. Furthermore, by using the hard mask material 336, a step of removing oxide (e.g., 141b in FIG. 1) by an etching process is not required so that the formation of divots from removing oxide is prevented. As a result, leakage from divots in isolation trenches may be prevented.

Figure 4A:
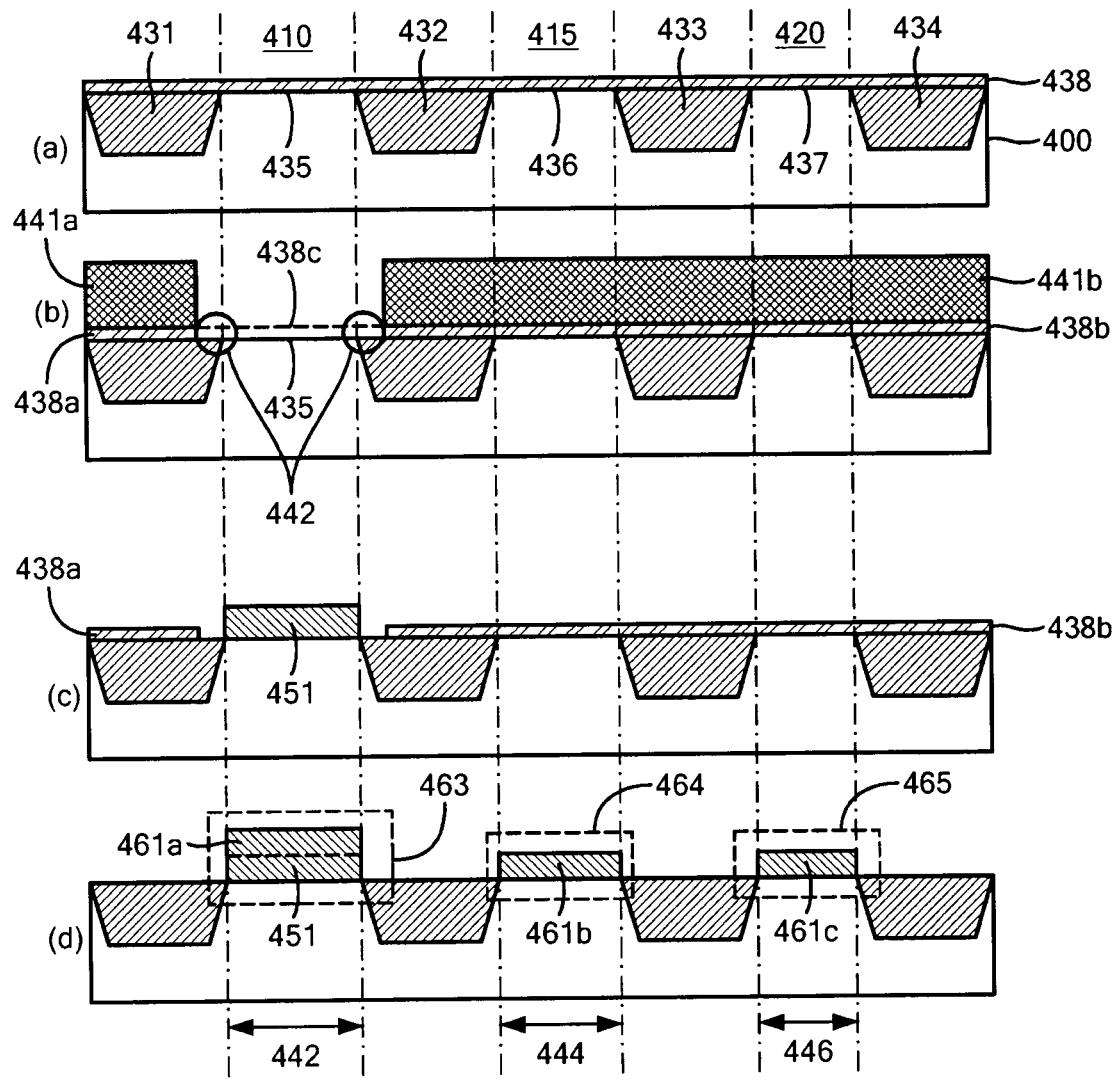
FIGS. 4A-4B are diagrams illustrating a process for forming triple gate oxides (Triple-GOX) according to an inventive concept described herein.
Figure 4B:
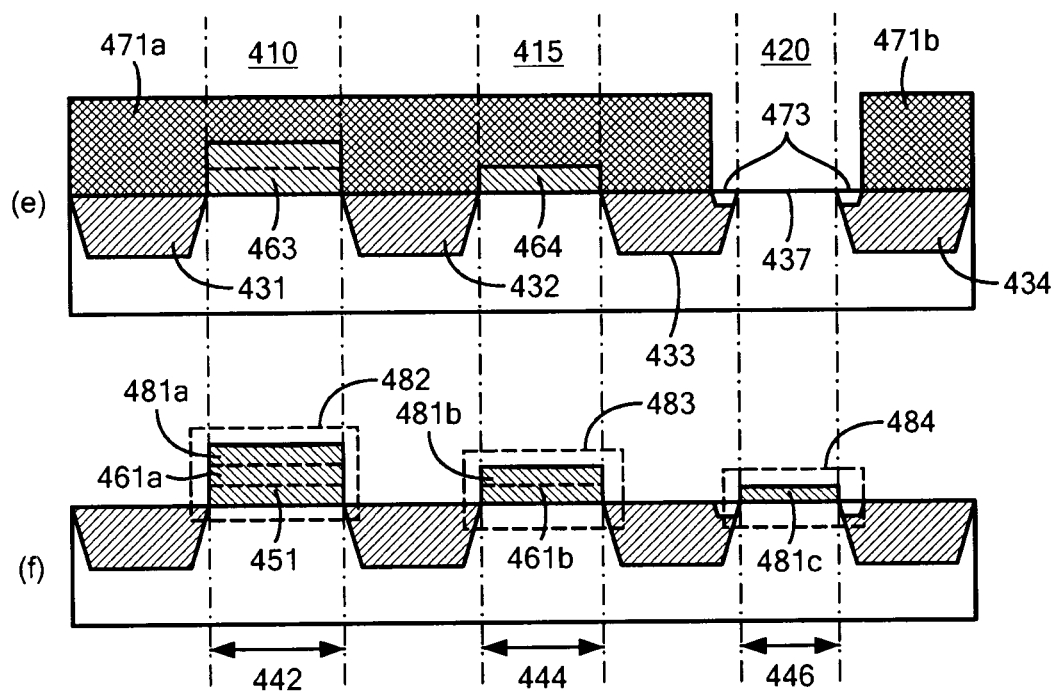

Referring now to FIGS. 4A and 4B, triple gate oxides (Triple-GOX) are formed in a substrate 400 using a hard mask according to an inventive concept described herein. In embodiments, the process described below may be applied to form other type of gate dielectrics instead of gate oxides. Referring to FIG. 4A, in step (a), one or more isolation trenches 431, 432, 433, 434 are formed in a substrate 400. The remaining regions of the substrate 400 form a surface 435 on a first active region 410, a surface 436 on a second active region 415, and a surface 437 on a third active region 420 respectively. In embodiments, the active regions 410, 415, 420 may have the same or different widths 442, 444, 446, while the widths are determined based upon the characteristics of gate oxides formed over the respective active regions. In embodiments, the isolation trenches 431, 432, 433, 434 may comprise Shallow Trench Isolation (STI), which may be filled with a suitable material, such as oxide. A hard mask material 438 may be deposited on a surface of the substrate 400 where the isolation trenches and active regions are located. In embodiments, the hard mask 438 may comprise at least one of Silicon Nitride (SiN), PolySilicon (poly-Si), and/or oxide-nitride-oxide (ONO) stack.

In step (b), a first photolithography process is performed to expose the area over the first active region 410. Accordingly, photoresist masks 441a, 441b may be formed on the surface of the substrate 400 except the first active region 410. A first etching process is then performed to remove a portion of the hard mask 438c over the second active region 420. Accordingly, the surface 435 on the first active region 410 is exposed, while the other area of the surface including the surface 436, 437 on the second and third active regions 415, 420 is covered by the hard mask 438a, 438b. In embodiments, some portions 442 of the hard mask 436 may be removed on the isolation trenches 431, 432 near the first active region 410.

In step (c), the photoresist masks 441a, 441b are then stripped. A layer of oxide 451 having a first thickness is then formed (i.e., grown) over the first active region 410. Since surfaces in the second and third active regions 415, 420 are protected by the hard mask 438a, 438b, no oxide is grown over the second and third active regions 415, 420.

In step (d), a further etching process is then performed to remove the hard masks 438a, 438b from the surface of the substrate 400. In embodiments, the hard masks 438a, 438b may be blanket-etched (i.e., no mask is applied for the second etching process). Accordingly, the surfaces 436, 437 on the second and third active regions 415, 420 are exposed. A second layer of oxide 461a, 461b, 461c having a second thickness is grown over the first, second, and third active regions 410, 415, 420 respectively. Accordingly, the oxide 463 formed over the first active region 410 has a thickness that is a sum of the first oxide layer 451 and the second oxide layer 461a, while the oxide 464, 465 formed over the second active region 415 and the third active region 420 respectively have a thickness of the second oxide layer 461b and 461c.

Referring to FIG. 4B, in step (e), a further photolithography process is performed to expose the area over the third active region 420. Accordingly, photoresist mask 471a, 471b material may cover the surface of the substrate 400 except the third active region 420. A further etching process is then performed to remove the oxide 461c (FIG. 4A) formed over the third active region 420. When the oxide 461c is removed over the third active region 420 by the etching process, divots 473 may be formed in isolation trenches 433, 434 near the third active region 420. The photoresist mask 471a, 471b material is then stripped. Accordingly, the oxide 463 formed over the first active region 410 and the oxide 464 formed over the second active region 415 are exposed while the oxide 465 (FIG. 4A) over the third active region 420 is removed, which exposes surface 437.

In step (f), a third layer of oxide 481a, 481b, 481c having a third thickness is grown over the first, second, and third active regions 410, 415; 420 respectively. Accordingly, a first gate oxide 482 formed over the first active region 410 has a thickness that is a sum of the first oxide layer 451, the second oxide layer 461a, and the third oxide layer 481a. The second gate oxide 483 formed over the second active region 415 has a thickness that is a sum of the second oxide layer 461b and the third oxide layer 481b. The third gate oxide 484 formed over the third active region 420 has a thickness of the third oxide layer 481c. Further, the active regions 410, 415, 420 may have the same or different widths 442, 444, 446. For example, the widths of the active regions may get narrower from the active region 410 to active region 420. In other embodiments, the active regions 410, 415, 420 may comprise the same width. Accordingly, the gate oxides over the first, second, and third active regions may have different characteristics.

In contrast with the conventional Triple-GOX forming method described in conjunction with FIGS. 2A and 2B, the number of oxide cycles in the second active region 415 and the third active region 420 is reduced to two from three cycles in the conventional method. Since the second active region 415 needs two layers of oxide, there is no unnecessary oxide growth cycle over the second active region 415. Further, forming divots in the second active region 415 is prevented.

Figure 5A:
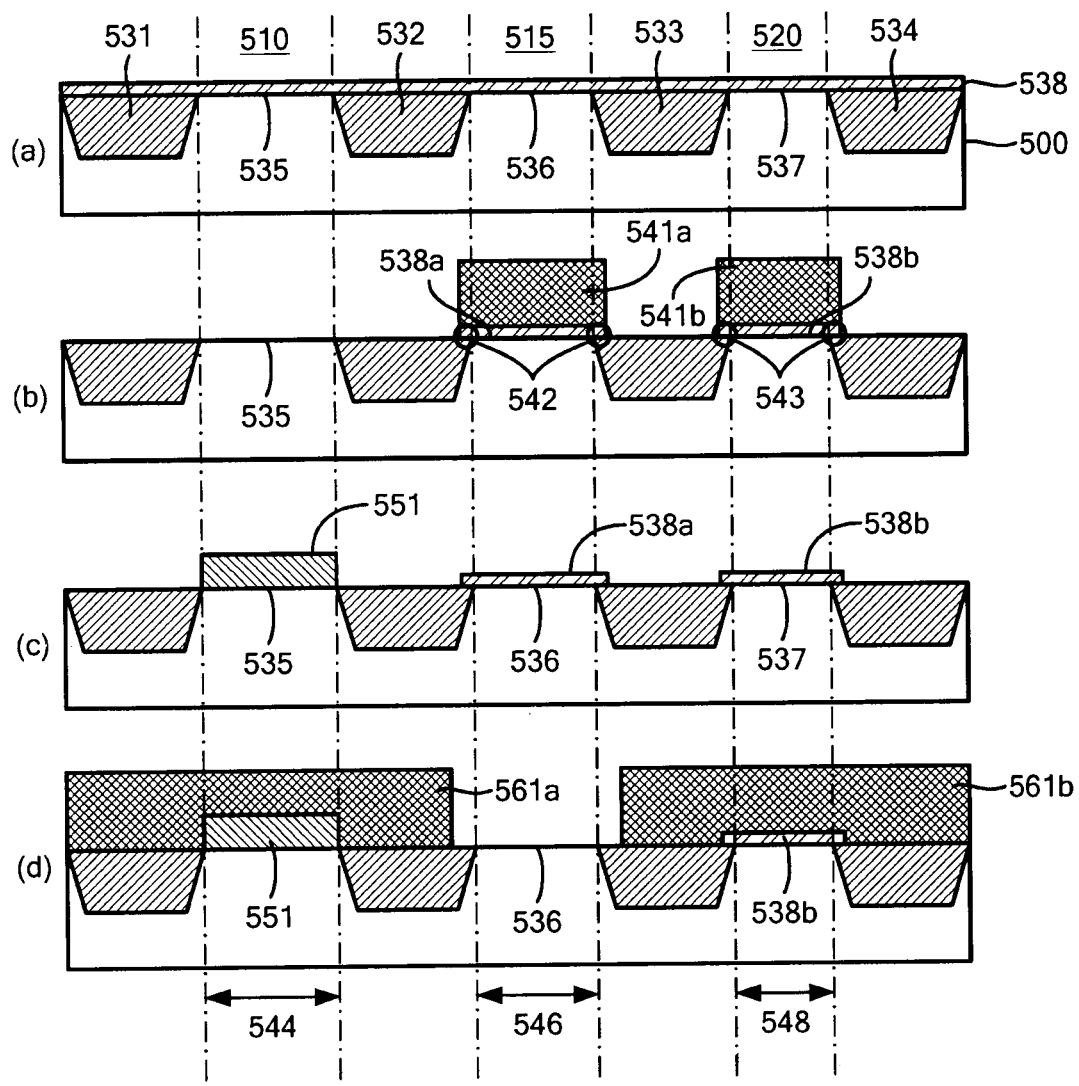
FIGS. 5A-5B are diagrams illustrating a process for forming triple gate oxides (Triple-GOX) according to another inventive concept described herein.
Figure 5B:
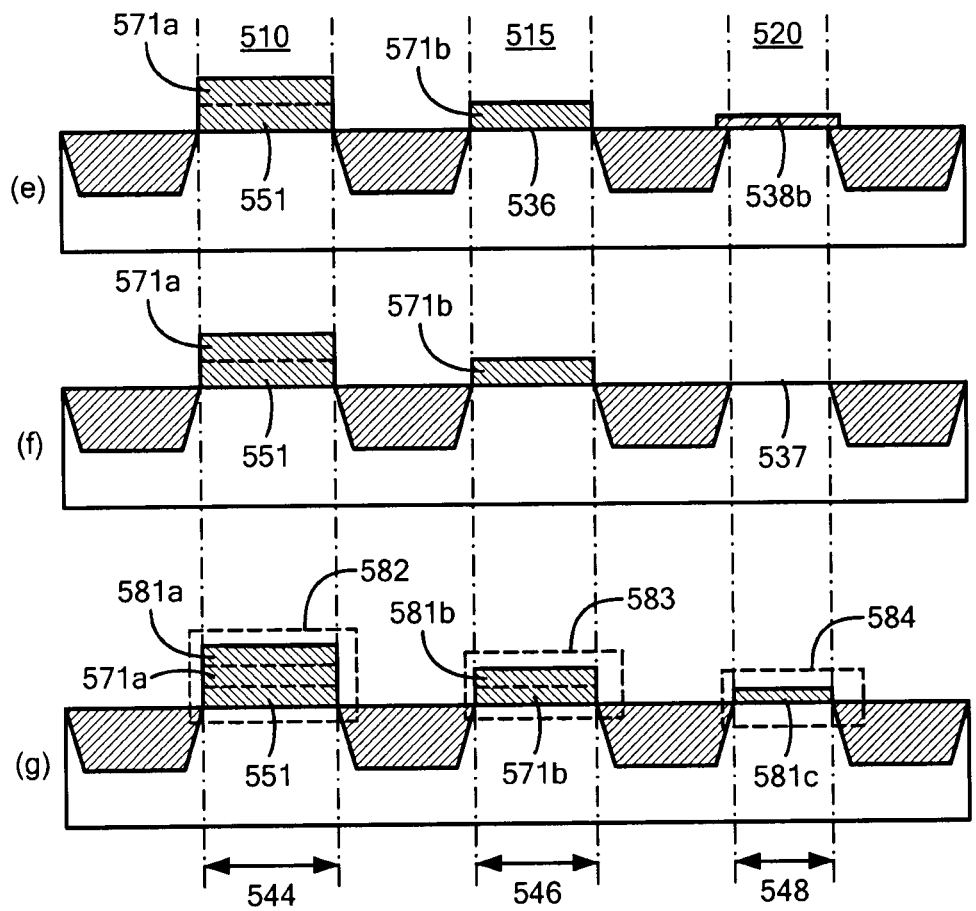

Referring now to FIGS. 5A and 5B, triple gate oxides (Triple-GOX) are formed in a substrate 500 using a hard mask according to another inventive concept described herein. In embodiments, the process described below may be applied to form other type of gate dielectrics instead of gate oxides. Referring to FIG. 5A, in step (a), one or more isolation trenches 531, 532, 533, 534 are formed in a substrate 500. The remaining regions of the substrate 500 may form a surface 535 on a first active region 510, a surface 536 on a second active region 515, and a surface 537 on a third active region 520 respectively. In embodiments, the active regions 510, 515, 520 may have the same or different widths 544, 546, 548, while the widths are determined based upon the characteristics of gate oxides formed over the respective active regions. In embodiments, the isolation trenches 531, 532, 533, 534 may comprise Shallow Trench Isolation (STI), which is filled with a suitable material, such as oxide. A hard mask 538 may be deposited on a surface of the substrate 500 where the isolation trenches and active regions are located. In embodiments, the hard mask 538 may comprise at least one of Silicon Nitride (SiN), PolySilicon (poly-Si), and/or oxide-nitride-oxide (ONO) stack.

In step (b), a first photolithography process is performed to expose the surface of the substrate 500 except the second and third active regions 515, 520. Accordingly, photoresist masks 541a, 541b may be formed over the surface of the second and third active regions 515, 520, particularly on the hard mask material 538a, 538b. A first etching process is then performed to remove portions of the hard mask 538 from the area where the photoresist masks 541a, 541b do not cover. Accordingly, the portions of the hard mask 538 other than the surface in the second and third active regions 515, 520 are etched away, which leaves hard masks 538a, 538b covering the second and third active regions 515, 520. In embodiments, some portions 542, 543 of isolation trenches 532, 534, 535 near the second and third active regions 515, 520 may be covered by the hard masks 536a, 538b.

In step (c), the photoresist masks 541a, 541b are then stripped. Here, the surface 535 on the first active region 510 is exposed, while the surfaces 536, 537 on the second and third active regions 515, 520 are covered by the hard masks 538a, 538b. A layer of oxide 551 having a first thickness is then formed (i.e., grown) over the first active region 510. Since surfaces in the second and third active regions 515, 520 are protected by the hard mask 538a, 538b, no oxide is grown over the second and third active regions 515, 520.

In step (d), a second photolithography process is performed to expose the area over the second active region 515. Here, photoresist mask 561a, 561b may cover the surface of the substrate 500 except the second active region 515. That is, the oxide 551 over the first active region 510 and the hard mask 538b over the third active region 520 are covered by the photoresist mask 561a, 561b. A further etching process is then performed to remove the hard mask 538a over the second active region 515, which exposes the surface 536 on the second active region 515.

Referring to FIG. 5B, in step (e), the photoresist masks 561a, 561b are stripped. Accordingly, the oxide 551 formed over the first active region 510 and the surface 536 over the second active region 515 are exposed, while the third active region 520 remains covered by the hard mask 538b. A second layer of oxide 571a, 571b having a second thickness is then formed over the first and second active regions 510, 515 respectively. In step (f), a further etching process removes the hard mask 538b in the third active region 520, which exposes the surface 537 on the third active region 520. In embodiments, the hard masks 538b may be blanket-etched (i.e., no mask is applied for the second etching process) using a material having a high selectivity to oxide.

In step (g), a third layer of oxide 581a, 581b, 581c having a third thickness is grown over the first, second, and third active regions 510, 515, 520 respectively. Accordingly, a first gate oxide 582 formed over the first active region 510 has a thickness that is a sum of the first oxide layer 551, the second oxide layer 571*a*, and the third oxide layer 581*a*. The second gate oxide 583 formed over the second active region 515 has a thickness that is a sum of the second oxide layer 571*b* and the third oxide layer 581*b*. The third gate oxide 584 formed over the third active region 520 comprises a third oxide layer 581*c*. Further, the active regions 510, 515, 520 may have the same or different widths 544, 546, 548. For example, the widths of the active regions may get narrower from the active region 510 to active region 520. In other embodiments, the active regions 510, 515, 520 may comprise the same width. Accordingly, the gate oxides over the first, second, and third active regions may have different characteristics.

The numbers of oxide growth cycles over the second active region 515 and the third active region 520 are reduced to two and one cycles respectively, in contrast with the conventional Triple-GOX forming method described in conjunction with FIGS. 2A and 2B that requires three oxide cycles for both regions. Accordingly, no unnecessary oxide cycle is performed over the first, second, and third active regions 510, 515, 520, which prevents unnecessary silicon stress. In addition, no divots are formed near active regions, which also prevents additional leakage between transistors.

Figure 6:
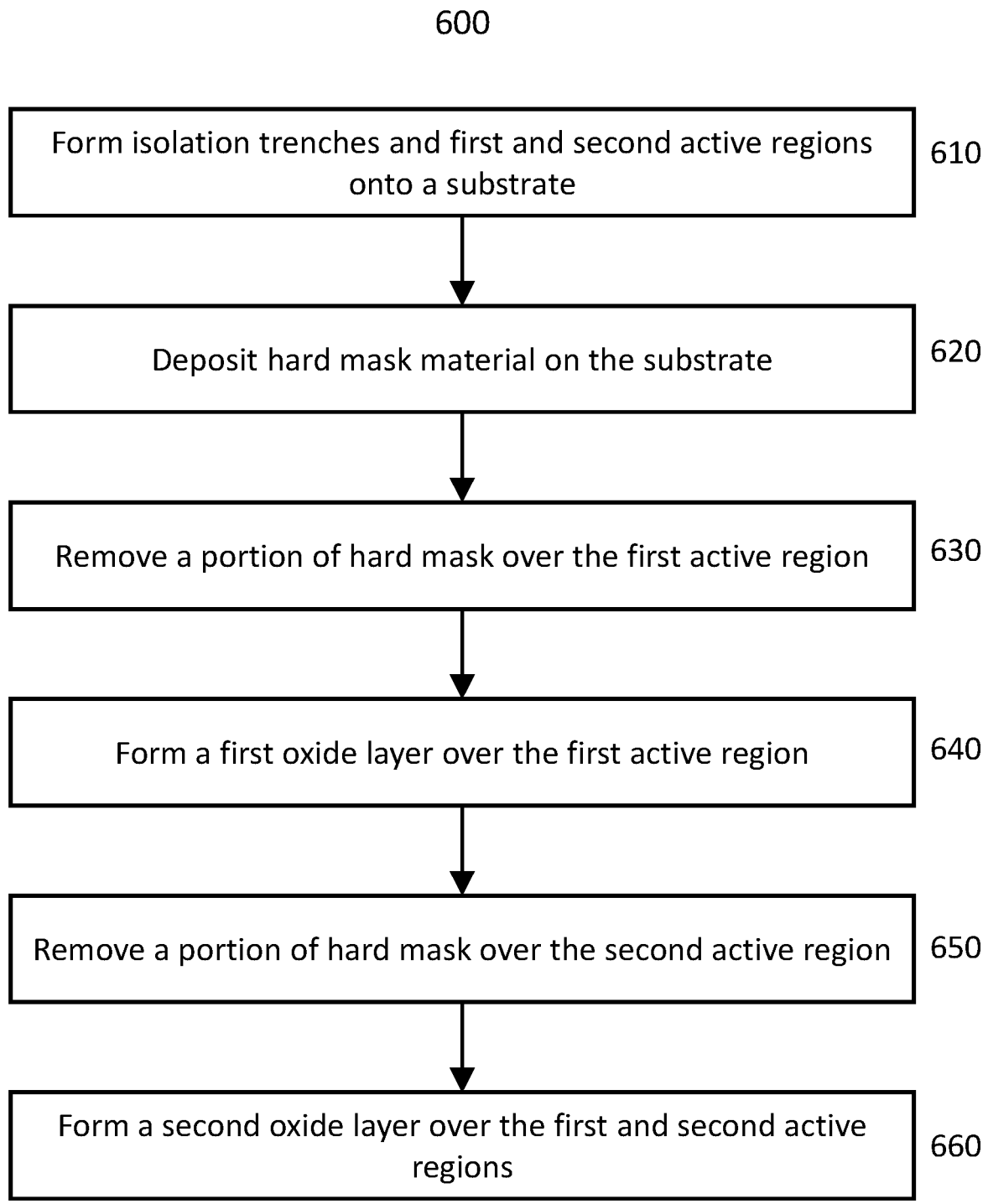
FIG. 6 is a flowchart of a process for forming dual gate oxides (Dual-GOX) according to an inventive concept described herein.
Figure 7:
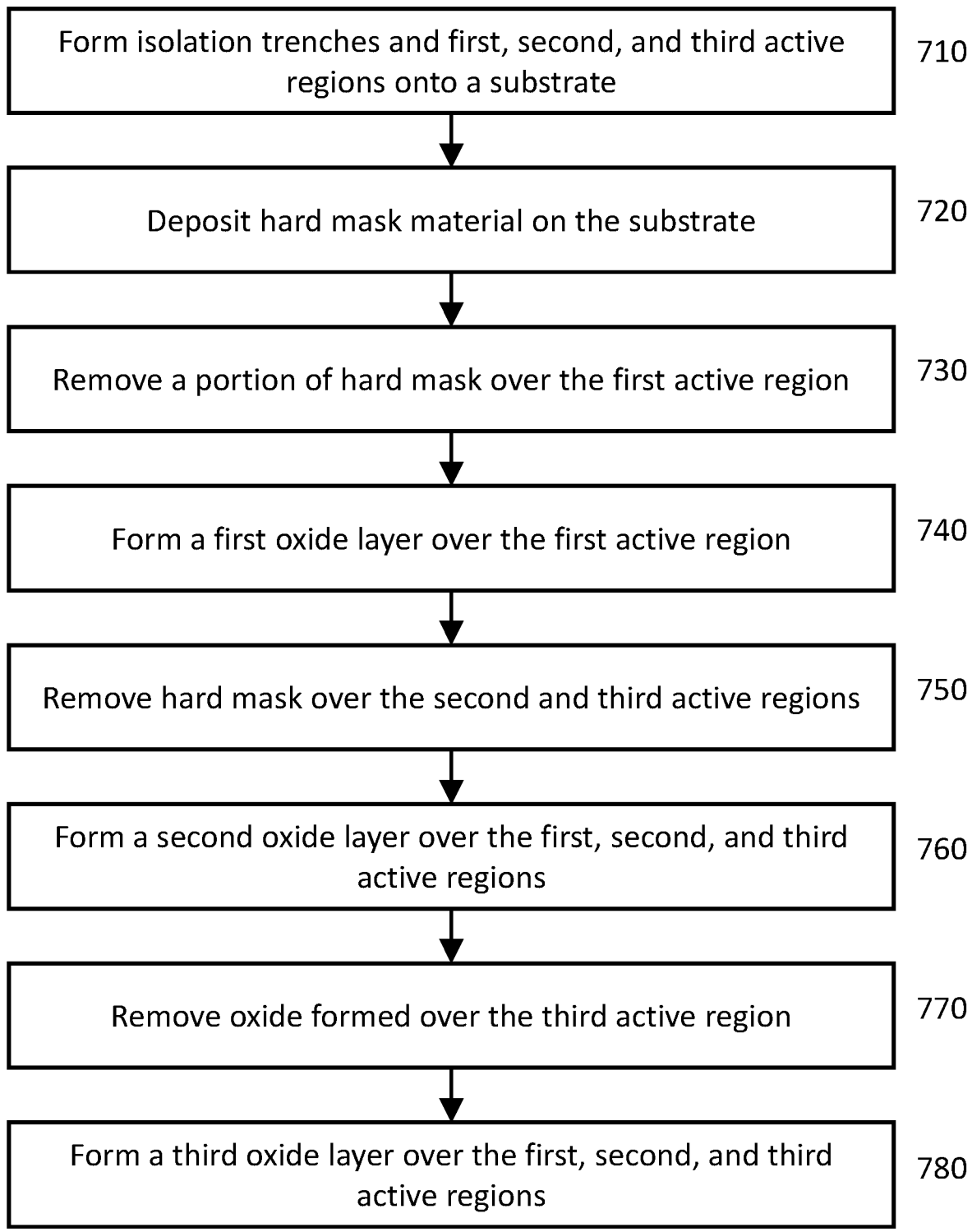
FIG. 7 is a flowchart of a process for forming triple gate oxides (Triple-GOX) according to an inventive concept described herein.
Figure 8:
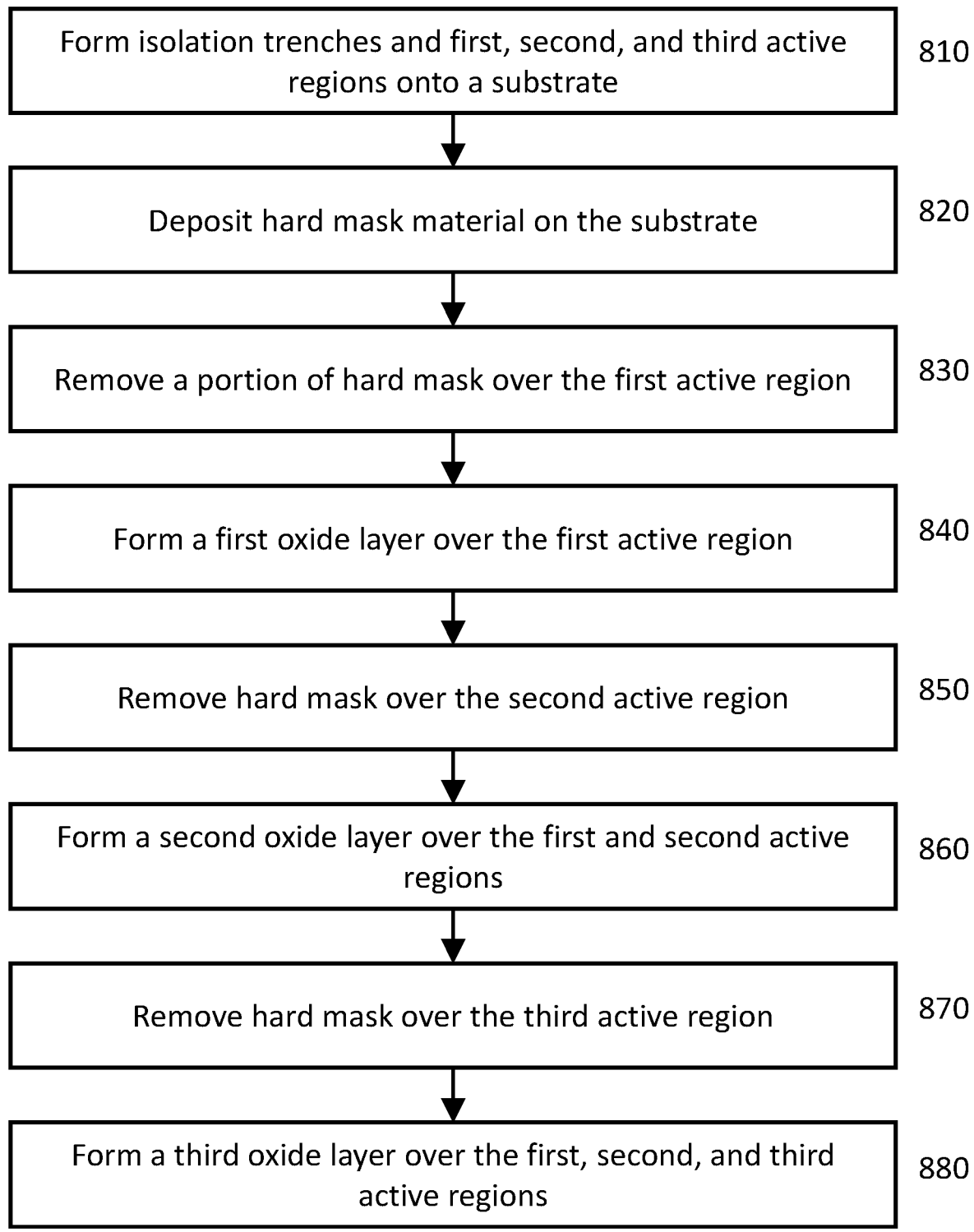
FIG. 8 is a flowchart of a process for forming triple gate oxides (Triple-GOX) according to another inventive concept described herein.

Referring now to FIGS. 6-8, illustrative flow diagram for forming multiple gate oxides are presented. In the figure, rectangular elements (typified by element 610 in FIG. 6), herein denoted a "processing block," represents an instruction or groups of instructions. The processing block may represent one or more steps performed in a process. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order.

Referring now to FIG. 6, the process 600 for forming dual gate oxides includes processing block 610, in which one or more isolation trenches (e.g., 331, 332, 333 in FIG. 3) and a first active region (e.g., 310 in FIG. 3) and a second active region (e.g., 320 in FIG. 3) are formed onto a substrate (e.g., 300 in FIG. 3). In embodiments, the process 600 described below may be applied to form other type of gate dielectric instead of gate oxide. In processing block 620, hard mask material (e.g., 336 in FIG. 3) is deposited on the substrate. In processing block 630, a first portion of the hard mask material over the first active region is removed. Accordingly, the surface (e.g., 334 in FIG. 3) on the first active region is exposed. In embodiments, the first active region may be exposed by a photolithography process and the portion of the hard mask material may be removed by an etching process. The remaining photoresist mask is then stripped. In processing block 640, a first oxide layer (e.g., 351 in FIG. 3) having a first thickness is formed over the first active region. In embodiments, the first oxide layer may be grown over the first active region in a furnace. In processing block 650, a second portion of the hard mask material over the second active region is removed. Accordingly, the surface (e.g., 335 in FIG. 3) on the second active region is exposed. In embodiments, the second portion of the hard mask material is removed by an etching process. In processing block 660, a second oxide layer (e.g., 361*a*, 361*b* in FIG. 3) having a second thickness is formed over the first and second active regions. Accordingly, the thickness of a gate oxide (e.g., 362 in FIG. 3) formed over the first active region comprises a sum of the thickness of the first oxide layer and the second oxide layer. The thickness of a gate oxide (e.g., 363 in FIG. 3) formed over the second active region comprises the thickness of the second oxide layer.

Referring now to FIG. 7, the process 700 for forming triple gate oxides includes processing block 710, in which one or more isolation trenches (e.g., 431, 432, 433, 434 in FIG. 4A) and a first active region (e.g., 410 in FIG. 4A), a second active region (e.g., 415 in FIG. 4A), and a third active region (e.g., 420 in FIG. 4A) are formed onto a substrate (e.g., 400 in FIG. 4A). In embodiments, the process 700 described below may be applied to form other type of gate dielectric instead of gate oxide. In processing block 720, a hard mask material (e.g., 438 in FIG. 4A) is deposited on the substrate. In processing block 730, a first portion of the hard mask material over the first active region is removed. Accordingly, the surface (e.g., 435 in FIG. 4A) on the first active region is exposed. In embodiments, the first active region is exposed by a photolithography process and the portion of the hard mask material over the first active region is removed by an etching process. The remaining photoresist mask is then stripped. In processing block 740, a first oxide layer (e.g., 451 in FIG. 4A) having a first thickness is formed over the first active region. In embodiments, the first oxide layer may be grown over the first active region in a furnace. In processing block 750, portions of the hard mask material over the second and third active regions are removed. Accordingly, the surfaces (e.g., 436, 437 in FIG. 4A) on the second and third active regions are exposed. In embodiments, the portions of the hard mask material are removed by a blanket-etching process. In processing block 760, a second oxide layer (e.g., 461*a*, 461*b*, 461*c* in FIG. 4A) having a second thickness is formed over the first, second, and third active regions. In processing block 770, the oxide (e.g., 465 in FIG. 4A) formed over the third active region is removed. In embodiments, the third active region is exposed by a photolithography process and the oxide formed over the third active region is removed by an etching process. The remaining photoresist mask is then stripped. In processing block 780, a third oxide layer (e.g., 481*a*, 481*b*, 481*c* in FIG. 4B) having a third thickness is formed over the first, second, and third active regions. Accordingly, the thickness of gate oxide (e.g., 482 in FIG. 4B) formed over the first active region comprises a sum of the thickness of the first, second, and third oxide layers. The thickness of a gate oxide (e.g., 483 in FIG. 4B) formed over the second active region comprises a sum of the thickness of the second and third oxide layers. The thickness of a gate oxide (e.g., 484 in FIG. 4B) formed over the third active region comprises the third thickness of the third oxide layer.

Referring now to FIG. 8, the process 800 for forming triple gate oxides includes processing block 810, in which one or more isolation trenches (e.g., 531, 532, 533, 534 in FIG. 5A) and a first active region (e.g., 510 in FIG. 5A), a second active region (e.g., 515 in FIG. 5A), and a third active region (e.g., 520 in FIG. 5A) are formed onto a substrate (e.g., 500 in FIG. 5A). In embodiments, the process 800 described below may be applied to form other type of gate dielectric instead of gate oxide. In processing block 820, a hard mask material (e.g., 538 in FIG. 5A) is deposited on the substrate. In processing block 830, a first portion of the hard mask material over the first active region is removed. Accordingly, the surface (e.g., 535 in FIG. 5A) over the first active region is exposed. In embodiments, the first active region is exposed by a photolithography process and the portion of the hard mask material over the first active region is removed by an etching process. In embodiments, the portions of the hard mask except over the second and third active regions may be removed. The remaining photoresist mask is then stripped. In processing block 840, a first oxide layer (e.g., 551 in FIG. 5A) having a first thickness is formed over the first active region. In embodiments, the first oxide layer may be grown over the first active region in a furnace. In processing block 850, a portion of the hard mask material over the second active region is removed. In embodiments, the second active region is exposed by a photolithography process and the portion of the hard mask material over the second active region is removed by an etching process. The remaining photoresist mask is then stripped. Accordingly, the surface (e.g., 536 in FIG. 5A) on the second active region is exposed. In processing block 860, a second oxide layer (e.g., 571a, 571b in FIG. 5B) having a second thickness is formed over the first and second active regions. In processing block 870, the remaining portion of the hard mask material (e.g., 538b in FIG. 5A) over the third active region is removed. In embodiments, the portion of the hard mask over the third active region is removed by a blanket-etching process. In processing block 880, a third oxide layer (e.g., 581a, 581b, 581c in FIG. 5B) having a third thickness is formed over the first, second, and third active regions. Accordingly, the thickness of gate oxide (e.g., 582 in FIG. 5B) formed over the first active region comprises a sum of the thickness of the first, second, and third oxide layers. The thickness of gate oxide (e.g., 583 in FIG. 5B) formed over the second active region comprises a sum of the thickness of the second and third oxide layers. The thickness of gate oxide (e.g., 584 in FIG. 5B) formed over the third active region comprises the thickness of the third oxide layer.

The inventive concepts described herein allow forming gate oxides having less (or preferably minimum) silicon defect formation by reducing the number of oxide formation cycles, and also preventing the formation of divots in isolation trenches near the edges of silicon oxidation. Accordingly, leakages between device regions from extra oxide formation cycles and/or divots in isolation trenches may be prevented. In an illustrated embodiment, test results (e.g., test results shown in IDDQ testing which is used for testing MOS integrated circuits for the presence of manufacturing faults) show noticeable improvements in the proposed solution from the prior art in one or two orders of magnitude.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:

1. A method for fabricating an integrated circuit, the method comprising:
    forming one or more isolation trenches and a first active region, a second active region, and a third active region in a substrate;
    depositing hard mask material on the substrate;
    removing a first portion of the hard mask material over the first active region;
    forming a first oxide layer having a first thickness over the first active region;
    removing a second portion of the hard mask material over the second and third active regions;
    forming a second oxide layer having a second thickness over the first, second and third active regions;
    removing oxide formed over the third active region; and
    forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness, wherein removing the first portion of the hard mask material further comprises:
    performing a photolithography process to expose the first active region;
    performing an etching process to remove the first portion of the hard mask material over the first active region; and
    removing photoresist material over the second and third active regions.

2. The method of claim 1, wherein the removing the second portion of the hard mask material further comprises:
    performing an etching process to remove the second portion of the hard mask material over the second and third active regions.

3. The method of claim 1, wherein the removing oxide over the third active region further comprises:
    performing a photolithography process to expose the third active region;
    performing an etching process to remove oxide over the third active region; and
    removing photoresist material over the first and second regions.

4. The method of claim 1, wherein the hard mask material comprises at least one of Silicon Nitride (SiN), PolySilicon (poly-Si), and/or oxide-nitride-oxide (ONO) stack.

5. A method for fabricating an integrated circuit, the method comprising:
    forming one or more isolation trenches and a first active region, a second active region, and a third active region in a substrate;
    depositing hard mask material on the substrate;
    removing a first portion of the hard mask material over the first active region;
    forming a first oxide layer having a first thickness over the first active region;
    removing a second portion of the hard mask material over the second active region;
    forming a second oxide layer having a second thickness over the first and second active regions;
    removing a third portion of the hard mask material over the third active region; and
    forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness, wherein removing the first portion of the hard mask material further comprises:

performing a photolithography process to expose the first active region;

performing an etching process to remove the first portion of the hard mask material over the first active region; and removing photoresist material over the second and third active regions.

6. The method of claim 5, wherein the removing the second portion of the hard mask material further comprises:

performing a photolithography process to expose the second active region;

performing an etching process to remove the second portion of the hard mask material over the second active region; and removing photoresist material over the first and third active regions.

7. The method of claim 5, wherein the removing the third portion of the hard mask material further comprises:

performing an etching process to remove the third portion of the hard mask material over the third active region.

8. The method of claim 5, wherein the hard mask material comprises at least one of Silicon Nitride (SiN), PolySilicon (poly-Si), and/or oxide-nitride-oxide (ONO) stack.

9. A method for fabricating an integrated circuit, the method comprising:

forming one or more isolation trenches and a first active region, a second active region, and a third active region in a substrate;

depositing hard mask material on the substrate;

removing a first portion of the hard mask material over the first active region;

forming a first oxide layer having a first thickness over the first active region;

removing a second portion of the hard mask material over the second and third active regions;

forming a second oxide layer having a second thickness over the first, second and third active regions;

removing oxide formed over the third active region; and forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness, wherein removing the oxide over the third active region further comprises:

performing a photolithography process to expose the third active region;

performing an etching process to remove oxide over the third active region; and removing photoresist material over the first and second regions.

10. The method of claim 9, wherein the removing the second portion of the hard mask material further comprises:

performing an etching process to remove the second portion of the hard mask material over the second and third active regions.

11. The method of claim 9, wherein the hard mask material comprises at least one of Silicon Nitride (SiN), PolySilicon (poly-Si), and/or oxide-nitride-oxide (ONO) stack.

12. A method for fabricating an integrated circuit, the method comprising:

forming one or more isolation trenches and a first active region, a second active region, and a third active region in a substrate;

depositing hard mask material on the substrate;

removing a first portion of the hard mask material over the first active region;

forming a first oxide layer having a first thickness over the first active region;

removing a second portion of the hard mask material over the second active region;

forming a second oxide layer having a second thickness over the first and second active regions;

removing a third portion of the hard mask material over the third active region; and forming a third oxide layer having a third thickness on the first, second and third active regions such that a thickness of oxide formed over the first active region comprises a sum of the thickness of the first, second, and third oxide layers, and a thickness of oxide formed over the second active region comprises a sum of the thickness of the second and third oxide layers, and a thickness of oxide formed over the third active region comprises the third thickness, wherein the removing the second portion of the hard mask material further comprises:

performing a photolithography process to expose the second active region;

performing an etching process to remove the second portion of the hard mask material over the second active region; and removing photoresist material over the first and third active regions.

13. The method of claim 12, wherein the removing the third portion of the hard mask material further comprises:

performing an etching process to remove the third portion of the hard mask material over the third active region.

14. The method of claim 12, wherein the hard mask material comprises at least one of Silicon Nitride (SiN), PolySilicon (poly-Si), and/or oxide-nitride-oxide (ONO) stack.

* * * * *